US009659907B2

(12) United States Patent
Zhai et al.

(10) Patent No.: US 9,659,907 B2
(45) Date of Patent: May 23, 2017

(54) DOUBLE SIDE MOUNTING MEMORY INTEGRATION IN THIN LOW WARPAGE FANOUT PACKAGE

(71) Applicant: Apple Inc., Cupertino, CA (US)

(72) Inventors: Jun Zhai, Cupertino, CA (US);
Kunzhong Hu, Cupertino, CA (US);
Chonghua Zhong, Cupertino, CA (US);
Mengzhi Pang, Cupertino, CA (US); Se Young Yang, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/680,539

(22) Filed: Apr. 7, 2015

(65) Prior Publication Data

US 2016/0300813 A1    Oct. 13, 2016

(51) Int. Cl.
| | |
|---|---|
| *H01L 23/48* | (2006.01) |
| *H01L 25/065* | (2006.01) |
| *H01L 21/56* | (2006.01) |
| *H01L 23/538* | (2006.01) |
| *H01L 23/00* | (2006.01) |
| *H01L 25/00* | (2006.01) |

(52) U.S. Cl.
CPC ........ *H01L 25/0657* (2013.01); *H01L 21/561* (2013.01); *H01L 23/5389* (2013.01); *H01L 24/19* (2013.01); *H01L 24/96* (2013.01); *H01L 24/97* (2013.01); *H01L 25/50* (2013.01); *H01L 21/568* (2013.01); *H01L 2224/0401* (2013.01); *H01L 2224/04105* (2013.01); *H01L 2224/12105* (2013.01); *H01L 2224/131* (2013.01); *H01L 2224/13144* (2013.01); *H01L 2224/16227* (2013.01); *H01L 2224/73204* (2013.01); *H01L 2224/92125* (2013.01); *H01L 2224/97* (2013.01); *H01L 2225/06517* (2013.01); *H01L 2225/06558* (2013.01); *H01L 2225/06572* (2013.01); *H01L 2225/06586* (2013.01); *H01L 2924/1433* (2013.01); *H01L 2924/1434* (2013.01); *H01L 2924/1436* (2013.01); *H01L 2924/18161* (2013.01); *H01L 2924/18162* (2013.01); *H01L 2924/3511* (2013.01)

(58) Field of Classification Search
USPC .................................. 257/737, 678, E23.001
See application file for complete search history.

(56) References Cited

U.S. PATENT DOCUMENTS

| | | | |
|---|---|---|---|
| 7,763,976 | B2 | 7/2010 | Tang et al. |
| 8,669,140 | B1 | 3/2014 | Muniandy et al. |
| 8,822,268 | B1 | 9/2014 | Magnuse |
| 2008/0224306 | A1 | 9/2008 | Yang |
| 2010/0213589 | A1 | 8/2010 | Hsieh |

(Continued)

OTHER PUBLICATIONS

PCT Invitation to Pay Fees for International Application No. PCT/US2016/020289, mailed May 13, 2016, 8 pages.

(Continued)

*Primary Examiner* — Timor Karimy
(74) *Attorney, Agent, or Firm* — Blakely, Sokoloff, Taylor & Zafman LLP

(57) ABSTRACT

Packages and methods of formation are described. In an embodiment, a package includes a redistribution layer (RDL) formed directly on a top die, and a bottom die mounted on a back surface of the RDL.

20 Claims, 8 Drawing Sheets

(56) References Cited

U.S. PATENT DOCUMENTS

| | | |
|---|---|---|
| 2011/0037169 A1* | 2/2011 | Pagaila .............. H01L 21/561 |
| | | 257/737 |
| 2013/0154091 A1 | 6/2013 | Wright et al. |
| 2014/0042600 A1 | 2/2014 | Kim et al. |
| 2014/0210107 A1 | 7/2014 | Zhai |
| 2014/0239497 A1 | 8/2014 | Yap |

OTHER PUBLICATIONS

Athikulwongse, et al., "Block-level Designs of Die-to-Wafer Bonded 3D ICs and Their Design Quality Tradeoffs," Design Automation Conference (ASP-DAC), 2013 18th Asia and South Pacific, 2013, pp. 687-692.

PCT International Search Report and Written Opinion for International Application No. PCT/US2016/020289, mailed Jul. 19, 2016, 24 pages.

* cited by examiner

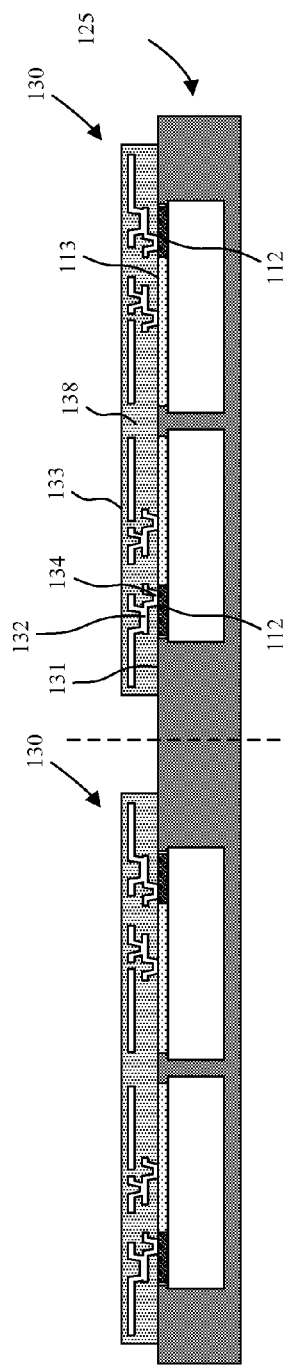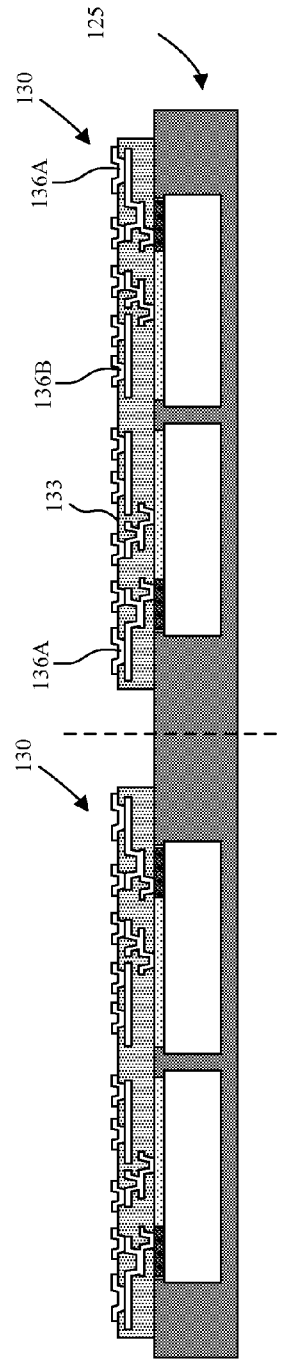

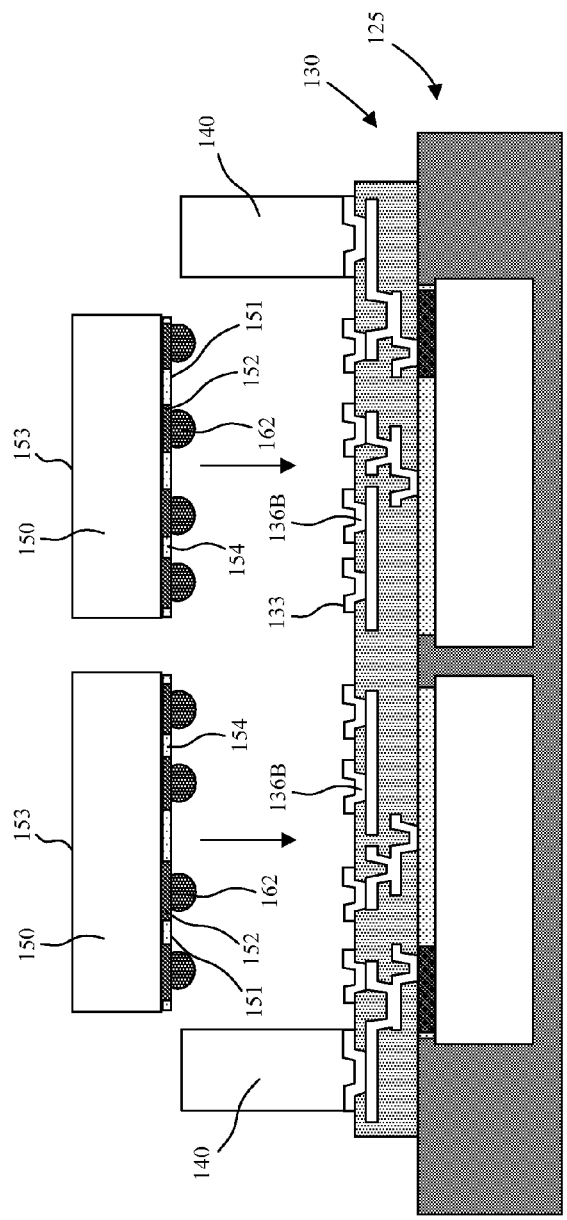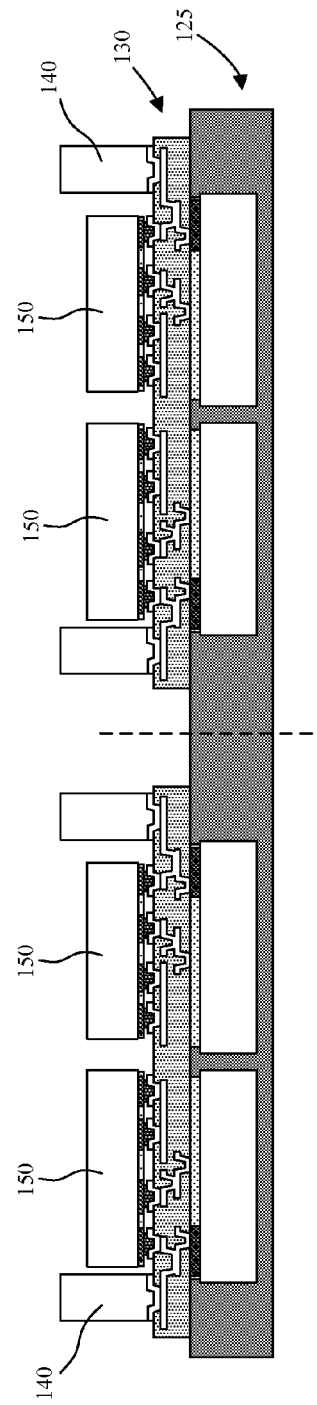
FIG. 7A
FIG. 7B

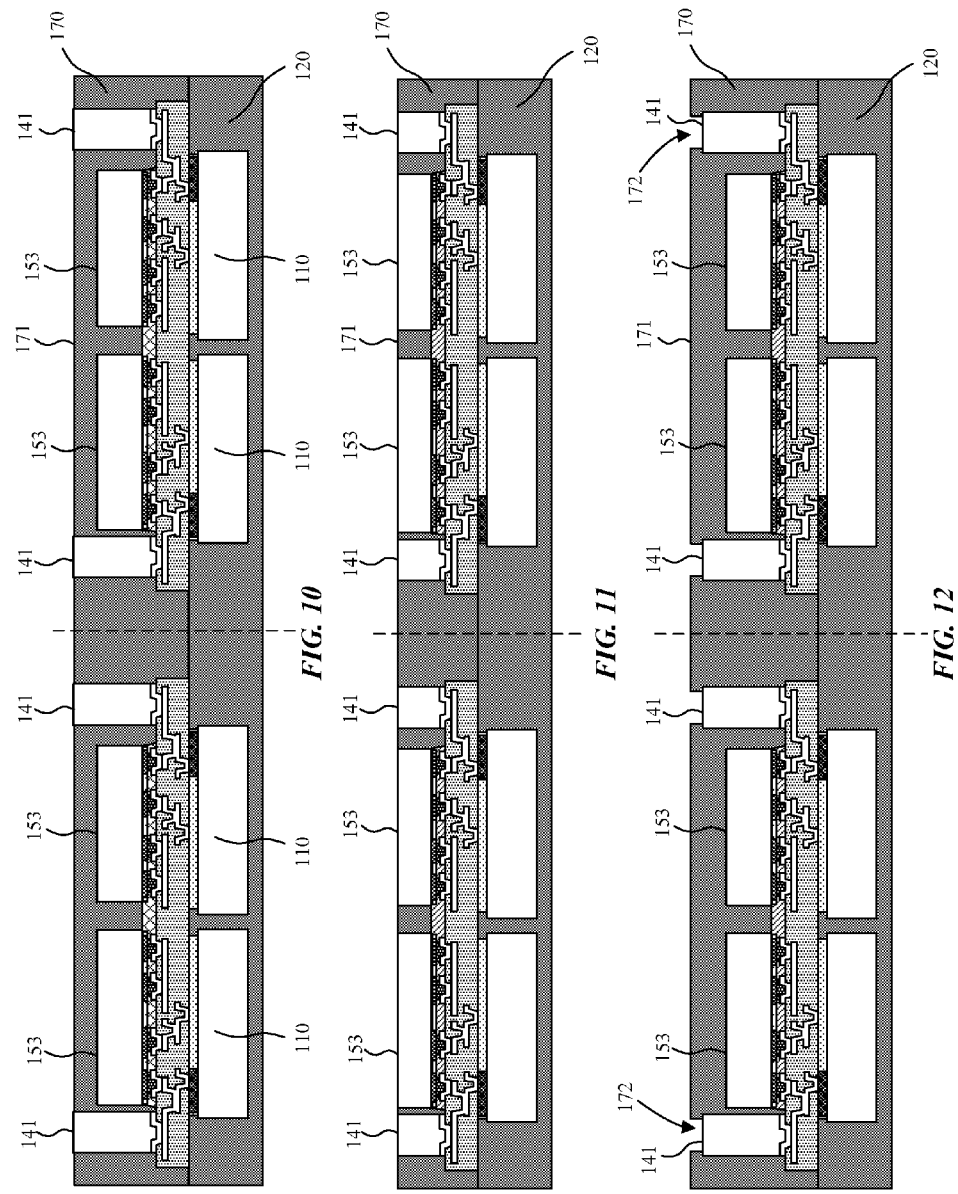

U.S. 9,659,907 B2

DOUBLE SIDE MOUNTING MEMORY INTEGRATION IN THIN LOW WARPAGE FANOUT PACKAGE

BACKGROUND

Field

Embodiments described herein relate to semiconductor packaging. More particularly, embodiments relate to fan out packages and methods of fabrication.

Background Information

The current market demand for portable and mobile electronic devices such as mobile phones, personal digital assistants (PDAs), digital cameras, portable players, gaming, and other mobile devices requires the integration of more performance and features into increasingly smaller spaces. As a result, various multiple-die packaging solutions such as system in package (SiP) and package on package (PoP) have become more popular to meet the demand for higher die/component density devices. In one implementation, a memory die or package (e.g., dynamic random-access memory (DRAM)) is stacked on top of a logic die or package (e.g., application-specific integrated circuit (ASIC)) or system on chip (SoC). As the market for portable and mobile electronic devices advances larger memory capability is required of the memory die or package. In one implementation, multiple memory die are stacked vertically to increase the memory in a top memory die package. The stacked die may be interconnected using wire bonds or through silicon vias.

SUMMARY

Double sided package structures and methods of fabrication are described. In an embodiment, a package includes one or more first die bonded to a front side of a redistribution layer (RDL) and one or more second die mounted on a back side of the RDL. For example, the second die may be mounted using a suitable surface mount technology such as flip chip and conductive bumps, such as solder bumps. A first redistribution line of the RDL is formed directly on a first contact pad of a first die, and a first molding compound encapsulates the one or more first die on the front side of the RDL. A plurality of conductive pillars extend from the back side of the RDL, and a second molding compound encapsulates the one or more second die and the plurality of conductive pillars on the back side of the RDL. A plurality of conductive bumps can be located on the plurality of conductive pillars.

In accordance with embodiments, a variety of configurations can be used to reduce package height. For example, the first molding compound may not completely cover a top surface of the one or more first die, and/or the second molding compound may not completely cover a bottom surface of the one or more second die. The top surface of the one or more first die and a top surface of the molding compound may be coplanar. Likewise, a bottom surface of the one or more second die, a bottom surface of the plurality of conductive pillars and/or a bottom surface of the second molding compound may be coplanar. For example, the coplanar surfaces may be achieved by an etching or grindback operation. In a particular embodiment, the one or more top and bottom die are memory die.

In an embodiment, a fan out package is formed by placing one or more first die on a carrier substrate, and encapsulating the one or more first die on the carrier substrate with a first molding compound. The carrier substrate is then removed and a redistribution layer (RDL) is formed on the first molding compound and the first die, with a redistribution line of the RDL formed directly on a contact pad along a bottom surface of the first die. A plurality of pillars are formed on a back side of the RDL, and one or more second die are mounted on the back side of the RDL inside a perimeter of the plurality of conductive pillars. For example, the second die may be mounted using a suitable surface mount technology such as flip chip and conductive bumps, such as solder bumps. The one or more second die are encapsulated with a second molding compound, and one or more conductive bumps may be formed on the plurality of conductive pillars.

In accordance with embodiments, a variety of configurations can be used to reduce package height. For example, a thickness of the first molding compound may be reduced to expose the one or more first die. Furthermore, a thickness of the first die may also be reduced, resulting in a planar top package surface in accordance with an embodiment. Likewise, a thickness of the second molding compound may be reduced to expose the one or more second die. Furthermore, a thickness of the second die may also be reduced, resulting in a planar bottom package surface.

BRIEF DESCRIPTION OF THE DRAWINGS

FIG. 4 is a cross-sectional side view illustration of an RDL formed on a reconstituted structure in accordance with an embodiment.

FIG. 5A is a cross-sectional side view illustration of an RDL formed on a reconstituted structure in accordance with an embodiment.

FIGS. 7A-7B are cross-sectional side view illustrations of mounting a plurality of die on an RDL in accordance with an embodiment.

FIG. 10 is a cross-sectional side view illustration of encapsulated plurality of conductive pillars with exposed bottom surfaces in accordance with an embodiment.

FIG. 11 is a cross-sectional side view illustration of encapsulated bottom die with exposed bottom surfaces and a plurality of conductive pillars with exposed bottom surfaces in accordance with an embodiment.

FIG. 12 is a cross-sectional side view illustration of a selectively patterned molding compound in accordance with an embodiment.

DETAILED DESCRIPTION

Figure 1:
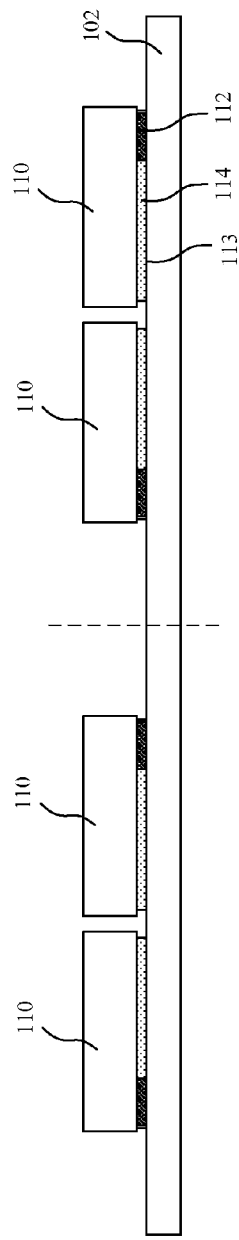
FIG. 1 is a cross-sectional side view illustration of a plurality of die placed on a carrier substrate in accordance with an embodiment.

Embodiments describe fan out packages and methods of fabrication, particularly methods utilizing fan out wafer level packaging (FOWLP) techniques. Die down fan out technology is a versatile fan out wafer level packaging (FOWLP) technology that may be used for addressing the demand for higher die/component density devices. FOWLP can entail encapsulating a die in a molding compound on a carrier substrate, removing the carrier substrate, and then building a redistribution layer (RDL) over the die and molding compound. The molding compound provides additional area for electrical fan out and optionally, a higher I/O count.

Embodiments describe double side mounted fan out packages in which die are mounted on both sides of an RDL. In various aspects, the packaging configurations in accordance with the described embodiments may allow for total package z-height reduction, increased device density (or memory capacity), and/or package warpage control which may additionally allow for the formation of wider packages within a controlled warpage tolerance.

In an embodiment, a package includes one or more first (top) die bonded to a front side of the RDL, where a first redistribution line of the RDL is formed directly on a first contact pad of one of the top die. A first molding compound encapsulates the one or more top die on the front side of the RDL. One or more second (bottom) die may be bonded to a back side of the RDL, and a plurality of conductive pillars extends from the back side of the RDL. For example, the one or more bottom die may be within a periphery of the plurality of conductive pillars. A second molding compound encapsulates the one or more bottom die on the back side of the RDL.

In one aspect, embodiments describe a double side mounted fan out package structure that may allow for total package z-height reduction. For example, forming the RDL directly on the top die may allow for the reduction of total package z-height by eliminating a standoff height associated with surface mounting processes, such as a solder bump height associated with a conventional flip chip attachment processes. The reduction of total package z-height may additionally be attributed to the use of an RDL for fan out, which may be considerably thinner than conventional polymer or laminate substrates and allow for the elimination of an additional silicon or organic interposer commonly used in PoP and SiP integration. Furthermore, total package z-height reduction may be attributed to disconnecting a thickness correlation of bottom die to vertical conductors commonly found in PoP solutions, where such a thickness correlation describes a standoff height between the bottom die and a routing layer above the bottom die. In accordance with embodiments, such a standoff height is eliminated by mounting the bottom die to a back side of the RDL. Total package z-height reduction may additionally be attributed to the one or more top and bottom die facing the RDL. In such a configuration it may be possible to back-grind a thickness of either or both of the top and bottom die and molding compounds further contributing to total package z-height reduction.

In yet another aspect, the ability to control the thickness of the top and bottom die and molding compounds may allow for a degree of control over package warpage. Thus, in accordance with embodiments, control of package z-height additionally allows control of package warpage. The ability to control package warpage may additionally allow for the formation of wider packages, as well as for side-by-side location of multiple die on the front and back sides of the RDL.

Embodiments may be applied in applications such as, and not limited to, low power and/or high I/O width memory architecture. Embodiments can enable a short double data rate (DDR) channel to neighboring function units (e.g., SOC, chipsets, etc.) by using RDL and direct chip attach. Embodiments may be particularly applicable for mobile applications that require low power DDR at target performance including high speed and wide I/O width. Adoption to high end application may also be possible with fine RDL redistribution line width and spacing for wide I/O interconnection, and scaling up of the appropriate memory density. Scalability may be inherited by double mounting memory die on the front and back of the RDL. In application, the packages can be integrated into PoP structures, for example as a top memory package in a PoP stack, as well as for direct mounting onto a system board. Further scaling up towards high density (dual rank) may be additionally facilitated through stacking of package units, which may be identical, on top of each other.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", and "on" as used herein may refer to a relative position of one layer with respect to other layers. One layer "above", "over", or "on" another layer or bonded "to" or in "contact" with another layer may be directly in contact with the other layer or may have one or more intervening layers. One layer "between" layers may be directly in contact with the layers or may have one or more intervening layers.

Referring now to FIG. 1, a cross-sectional side view illustration is provided of a plurality of first (top) die 110 mounted on a carrier substrate 102, such as a silicon wafer, glass panel, metal panel, etc. The carrier substrate 102 may additionally include an adhesive layer for mounting the plurality of die. In an embodiment each die 110 includes a bottom surface 113 with one or more exposed contact pads 112, and optionally passivation layer 114. In a particular embodiment, die 110 are memory die such as, but not limited to, dynamic random access memory (DRAM). Die 110 may be the same die, with same size, shape, and memory capacity. Alternatively die 110 may be different types of die, or for example, memory die with different size, shape, and/or capacity.

While embodiments describe a fan out package, and in particular a fan out memory package, embodiments are not necessarily limited to memory die, and the particular packaging configurations and sequences described may be used for other packages and including different types of die (e.g., logic) or components, such as passive devices including capacitors or inductors, microelectromechanical systems (MEMS) devices, sensors, etc.

Figure 2:
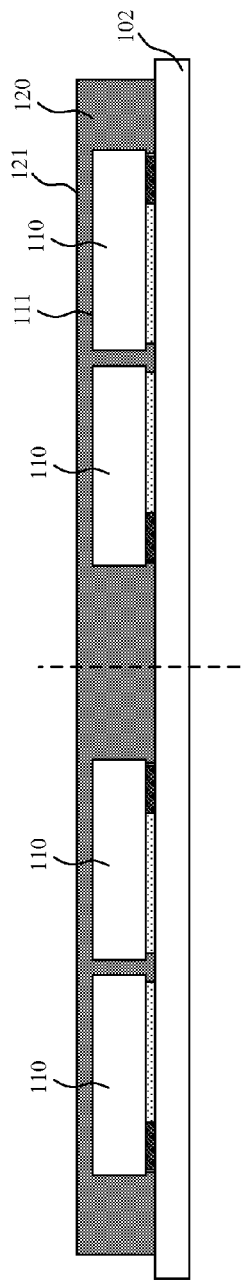
FIG. 2 is a cross-sectional side view illustration of a plurality of die encapsulated in a first molding compound in accordance with an embodiment.

As shown in FIG. 2, the plurality of die 110 are then encapsulated in a first molding compound 120 on the carrier substrate 102. For example, the first molding compound 120 may include a thermosetting cross-linked resin (e.g., epoxy), though other materials may be used as known in electronic packaging. Encapsulation may be accomplished using a suitable technique such as, but not limited to, transfer molding, compression molding, and lamination. As used herein, "encapsulated" does not require all surfaces to be encased within a molding compound. In the embodiment illustrated in FIG. 2 the lateral sides of die 110 are encased in the molding compound 120 and the top surface 121 of molding compound 120 is also formed over the top surface 111 of tallest die 110, though it is not required for the molding compound to cover the top surface 111 of the tallest die 110. In an embodiment, the molding compound 120 is continuous across the carrier substrate 102, covering a plurality of groupings of die 110 that will subsequently be singulated, for example, along the dotted lines to form separate packages.

In accordance with embodiments, one or more die 110 are included in each package. In an embodiment a plurality of die 110 are included in each package. As described in further detail below, the ability to control thickness of the die and molding compounds on opposite sides of the RDL, and hence package warpage, may additionally allow for the formation of wider packages, as well as for side-by-side location of multiple die on the front and back sides of the RDL.

Figure 3:
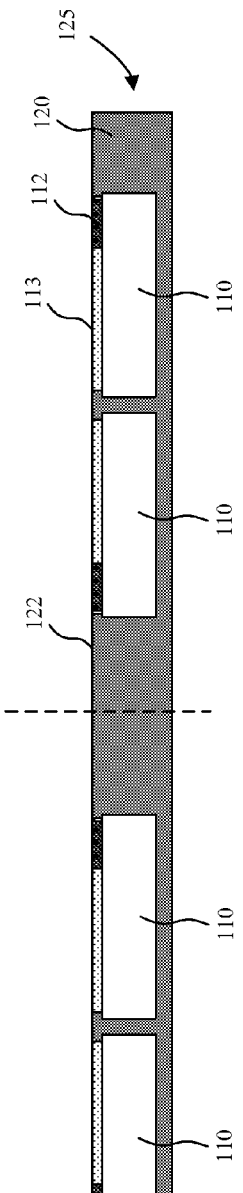
FIG. 3 is a cross-sectional side view illustration of a reconstituted structure after removal of a carrier substrate in accordance with an embodiment.

The carrier substrate 102, including any optional adhesive layer, may then be removed to expose the bottom surfaces 113 of the die 110 as illustrated in FIG. 3, resulting in the formation of a reconstituted wafer or panel 125. Given the method of manufacture, in an embodiment a bottom surface 122 of the first molding compound 120 may be coplanar with the bottom surfaces 113 of the die 110, and thus the exposed surfaces of the contact pads 112 and optionally passivation layer 114 corresponding to the bottom surfaces 113 of the die 110.

Referring now to FIG. 4, a redistribution layer (RDL) 130 is formed on the reconstituted wafer/panel 125 of FIG. 3, with a front surface 131 of the RDL 130 formed on the first molding compound 120 and the one or more die 110. The RDL 130 may include a single redistribution line 132 or multiple redistribution lines 132 and dielectric layers 138. The RDL 130 may be formed by a layer-by-layer process, and may be formed using thin film technology. In an embodiment, RDL 130 includes embedded redistribution lines 132 (embedded traces). For example, the redistribution lines 132 may be created by first forming a seed layer, followed by forming a metal (e.g., copper) pattern. Alternatively, redistribution lines may be formed by deposition (e.g., sputtering) and etching. The material of redistribution lines 132 can include, but are not limited to, a metallic material such as copper, titanium, nickel, gold, and combinations or alloys thereof. The metal pattern of the redistribution lines 132 is then embedded in a dielectric layer 138, which is optionally patterned. The dielectric layer 138 may be any suitable material such as an oxide, or polymer (e.g., polyimide).

In accordance with embodiments, the RDL 130 may have a thickness that is less than conventional organic or laminate substrates. For example, a conventional six layer organic or laminate substrate may have a thickness of 300 µm-500 µm. Thickness of the RDL 130 may be determined by the number of conductive redistribution lines 132 and dielectric layers 138 as well as the manner for formation. In accordance with embodiments, conductive redistribution lines may have a thickness of approximately 3-10 µm, and dielectric layers have a thickness of 2-5 µm. The RDLs in accordance with embodiments may additionally allow for narrower line spacing width (fine pitch) and thinner lines compared to conventional organic or laminate substrates. In an embodiment, the RDL 130 has total a thickness of less than 50 µm, or more specifically approximately 30 µm or less, such as approximately 20 µm. In the embodiment illustrated, redistribution lines 132 are formed directly on the contact pads 112 (e.g. without bumping) along the bottom surfaces 113 of the die 110. More specifically, contact pads 134 of the redistribution lines 132 are formed directly on the contact pads 112.

Figure 5B:
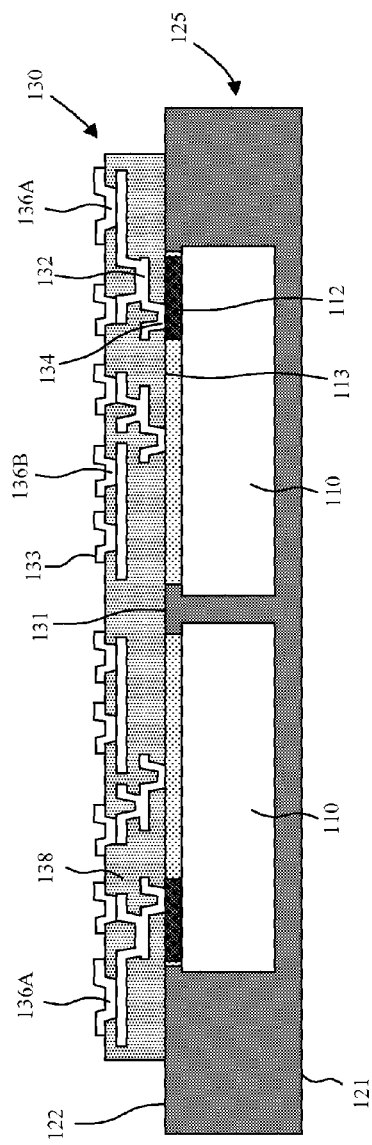
FIG. 5B is a close-up cross-sectional side view illustration of an RDL formed on a reconstituted structure in accordance with an embodiment.

Referring now to FIG. 5A, in an embodiment, the back side 133 of the RDL 130 includes landing pads such as under bump metallurgy (UBM) pads 136A, 136B. A close up illustration of the RDL 130 is illustrated in FIG. 5B, including the UBM pads 136A, 136B, and contact pads 134 of the redistribution lines 132 formed directly on the contact pads 112 of the die 110. For example, UBM pads 136A may have a larger width, such as approximately 200 µm for subsequent conductive pillar bumping, while UBM pads 136B may have a comparatively smaller width, such as approximately 50 µm for subsequent die attachment.

Figure 6:
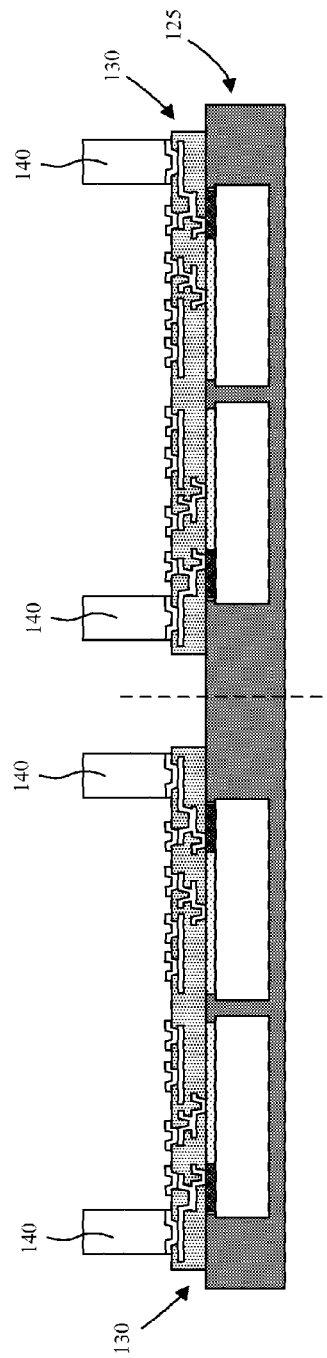
FIG. 6 is a cross-sectional side view illustration of the formation of conductive pillars on an RDL in accordance with an embodiment.

Referring to FIG. 6, conductive pillars 140 are formed on top of the UBM pads 136A. The material of conductive pillars 140 can include, but is not limited to, a metallic material such as copper, titanium, nickel, gold, and combinations or alloys thereof. Conductive pillars 140 may be formed using a suitable processing technique, and may be formed of a variety of suitable materials (e.g., copper) and layers. In an embodiment, conductive pillars 140 are formed by a plating technique, such as electroplating using a patterned photoresist layer to define the pillar structure dimensions, followed by removal of the patterned photoresist layer.

Referring now to FIGS. 7A-7B, one or more second (bottom) die 150 may be attached to the back side 133 of the RDL 130 using the reconstituted wafer/panel 125 as a carrier. In a specific embodiment die 150 are memory die. For example, die 150 may be the same or different memory die than die 110, and may each have the same or different size, shape, and/or memory capacity. In the embodiment illustrated, one or more die 150 are mounted on the RDL 130 within a periphery of the plurality of conductive pillars 140. For example, the die 150 may be mounted using a surface mount technology such as flip chip. FIGS. 7A-7B illustrate conductive pillars 140 as being taller than die 150 thickness. However, the die 150 may have approximately the same thickness as the conductive pillar 140 height, or die 150 may be thicker than the conductive pillar 140 height.

In the embodiment illustrated, a top surface 151 of die 150 is attached to (e.g. surface mounted on) the back side 133 of the RDL 130 with conductive bumps 162, such as solder bumps or stud bumps. The top surface 151 of the die 150 includes the conductive contacts 152 and passivation layer 154, and the die 150 is directly electrically coupled to the RDL 130, for exampl to the landing pads such as UBM pads 136B. In this configuration, each die 150 is facing toward to the reconstituted wafer/panel 125. A non-conductive paste (NCP) or non-conducive film (NCF) may optionally laterally surround the conductive bumps 162. In such an embodiment, bonding may be accomplished using thermal compression. Conductive bumps 162 may be formed of a material, such as gold or solder material, that may form a bond joint (e.g. intermetallic compound or alloy) with the landing pads such as UBM pads 136B. In an embodiment, die 150 is surface mounted on the back side 133 of RDL 130 with an anisotropic conductive film (ACF) directly between a conductive bump 162 of die 150 and a landing pad such as UBM pad 136 of RDL 130. In an embodiment, the bottom surface 153 of the die 150 does not include any conductive contacts 152.

Figure 8:
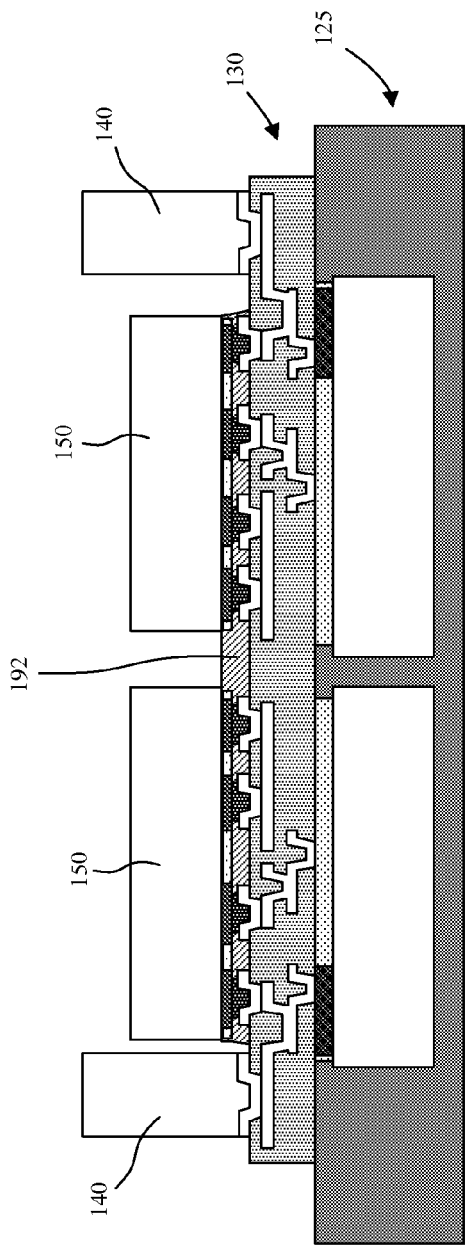
FIG. 8 is a close-up cross-sectional side view illustration of applying an underfill material in accordance with an embodiment.

Referring now to FIG. 8, an electrically insulating material 192 may optionally be applied between the die 150 and RDL 130. For example, the material 192 can be a capillary underfill (CUF) material used in flip chip bonding such as a snap cure underfill. Exemplary underfill materials include, but are not limited to polymer or epoxy. Material 192 can also be a non-conductive paste. In other embodiments, a CUF process is not used.

Figure 9:
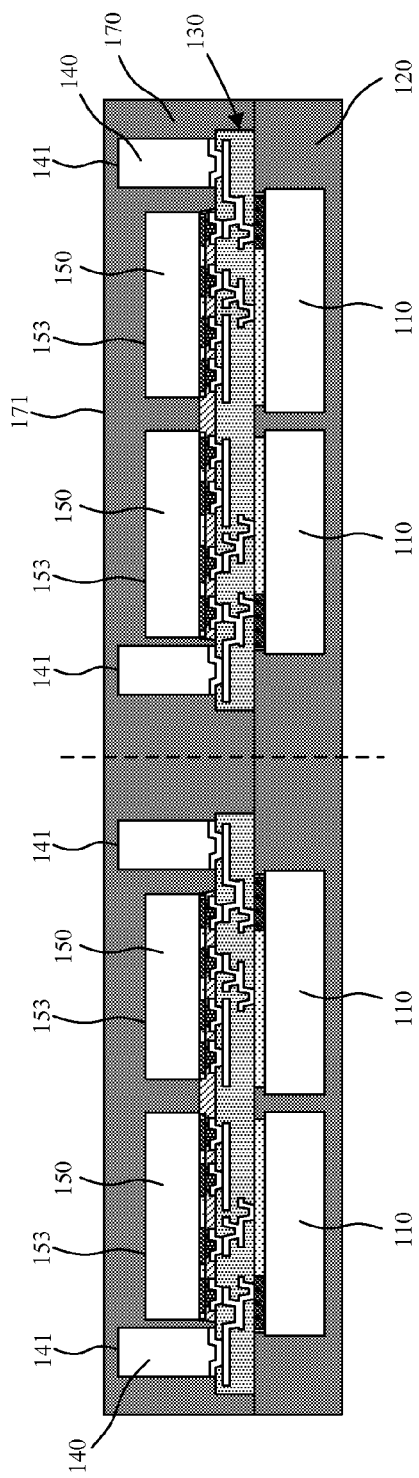
FIG. 9 is a cross-sectional side view illustration of encapsulated bottom die and a plurality of conductive pillars in accordance with an embodiment.

Referring now to FIG. 9, the one or more second (bottom) die 150 and conductive pillars 140 are encapsulated in a second molding compound 170 in accordance with embodiments. Second molding compound 170 can be the same material as the first molding compound 120. In the embodiment illustrated, a bottom surface 171 of the molding compound 170 covers the bottom surfaces 153 of the die 150, as well as the bottom surfaces 141 of the conductive pillars 140. However such a configuration is not required. Indeed the bottom surface of the die 150 and/or bottom surface of the conductive pillars 140 can be exposed during the encapsulation process or after encapsulation. In an embodiment a molded underfill (MUF) process is used, in which the second molding compound 170 is used to fill the space between the die 150 and the RDL 130 rather than a CUF material.

Referring to FIG. 10, an embodiment is illustrated in which the bottom surfaces 141 of the conductive pillars 140 are exposed, and not covered by the second molding compound 170. This may be a result of the encapsulation process. This may alternatively be the result of etching or back-grinding, for example, by chemical mechanical polishing (CMP). A thickness of the conductive pillars 140 may optionally be reduced during etching or back-grinding. In an embodiment, the bottom surface 171 of the second molding compound 170 is coplanar with the bottom surfaces 141 of the conductive pillars 140.

While the bottom surfaces 153 of the die 150 are illustrated in FIG. 10 as being covered by the second molding compound 170 this is not required. For example, in the embodiment illustrated in FIG. 11, the bottom surfaces 153 of the die 150 are exposed, and not covered by the second molding compound. This may be the result of the encapsulation process. This may alternatively be the result of etching or back-grinding, for example by CMP. A thickness of the conductive pillars 140, second molding compound 170, and/or die 150 may optionally be reduced during etching or back-grinding. In an embodiment, the bottom surface 171 of the second molding compound 170 is coplanar with the bottom surfaces 141 of the conductive pillars 140 and bottom surfaces 153 of the die 150. In accordance with embodiments, the ability to control thickness of the die and molding compounds on opposite sides of the RDL allows for the formation of thinner packages. Controlling the thickness may additionally allow for additional control over package warpage.

Embodiments are not limited to structures in which the conductive pillars 140 are exposed as a result of the encapsulation process or back-grinding. FIG. 12 is a cross-sectional side view illustration of a molding and patterning procedure. In the embodiment illustrated, the initial encapsulation operation may result in the molding compound 170 spreading over the conductive pillars 140, and optionally the bottom surfaces 153 of die 150. Following encapsulation, the molding compound 170 is patterned to form openings 172 to expose the bottom surfaces 141 of the conductive pillars 140. Thus, rather than globally grinding or etching back, a selective patterning technique, such as laser drilling or chemical etching, can be used to expose the conductive pillars 140.

While FIGS. 10-12 have been described separately, the processes are not necessarily exclusive from one another and may be combined in some embodiments, or may have variations.

Figure 13:
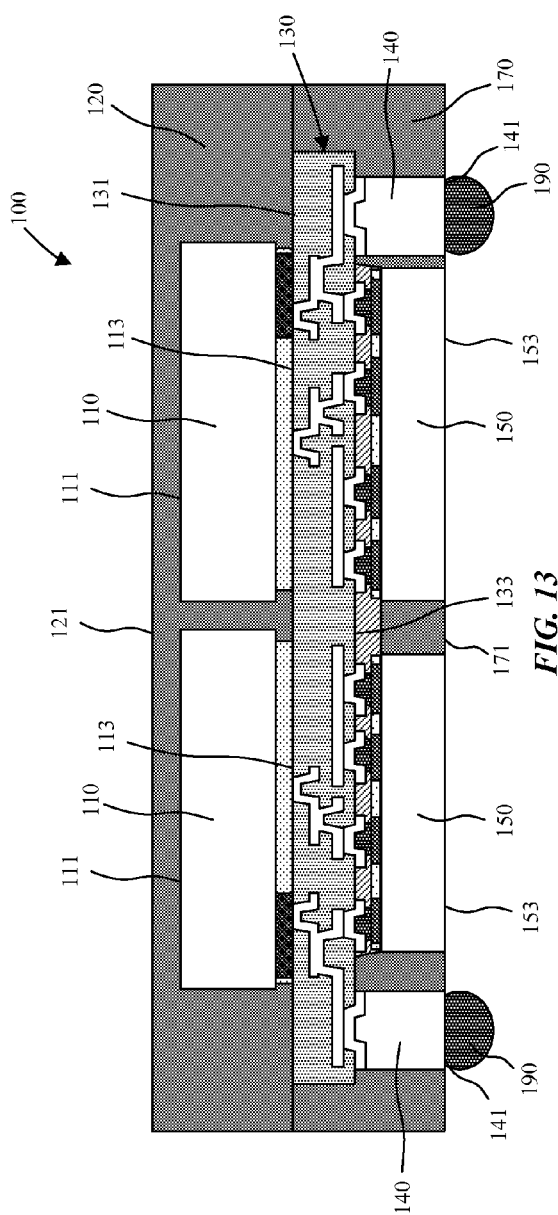
FIG. 13 is a cross-sectional side view illustration of a singluated package including conductive bumps on bottom surfaces of the plurality of conductive pillars in accordance with an embodiment.

Following the formation and processing of the second molding compound 170 conductive bumps 190 may be attached to or grown on the exposed bottom surfaces 141 of the conductive pillars 140 and individual packages 100 singulated as illustrated in FIG. 13. A variety of structures can be used for conductive bumps 190. For example, the conductive bumps 190 may be attached solder bumps, as illustrated, or plated pillars.

Figure 14:
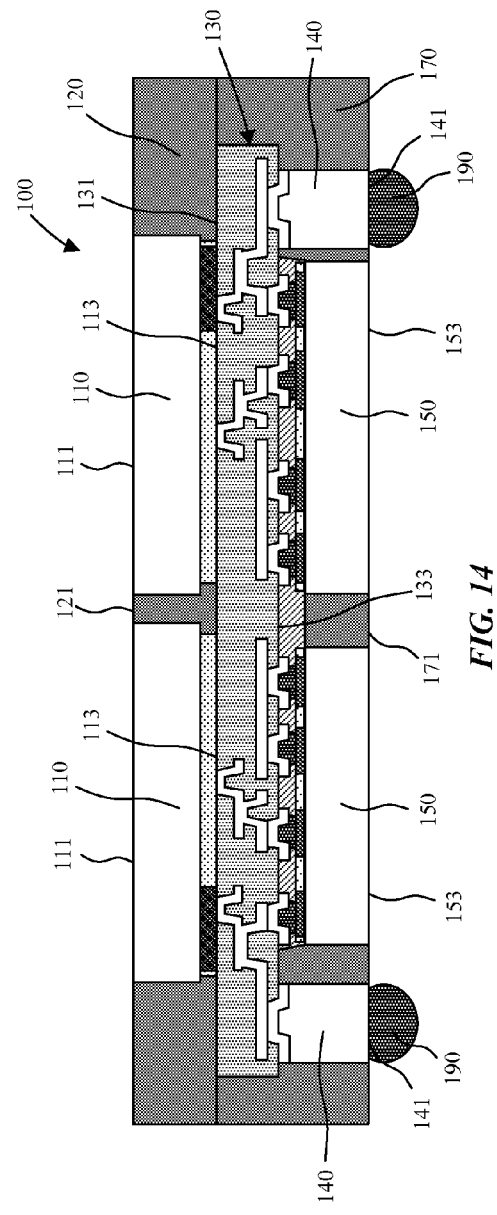
FIG. 14 is a cross-sectional side view illustration of a singluated package including thinned top and bottom die and molding compounds in accordance with an embodiment.

Up until this point, the top surfaces 111 of die 110 have been illustrated as being covered by the top surface 121 of the first molding compound 120. In the embodiment illustrated in FIG. 14 the top surface 111 of at least one die 110 is exposed, and not covered by the first molding compound 120. For example, this may be attributed to the initial encapsulation process, or alternatively accomplished through an etching or grind-back operation, which could be performed after the initial encapsulation process with the first molding compound 120 or after encapsulation with the second molding compound 170. In an embodiment, the top surface 121 of the first molding compound 120 is coplanar with the top surfaces 111 of the die 110. In accordance with embodiments, the ability to control thickness of the die and molding compounds on opposite sides of the RDL allows for the formation of thinner packages. Since this package has encapsulation material and silicon contents on both sides of RDL 130 controlling the thickness may additionally allow for additional control over package warpage. In addition to controlling thickness, encapsulation materials can also be used to control package warpage through using materials with different properties and/or thicknesses on both sides of RDL 130. So a very low high temperature warpage (20 μm or less) package may be achieved. In an embodiment, package 100 has a total thickness (or z-height) of approximately 300 μm or less, excluding height of the conductive bumps 190. For example, the distance between the top surfaces 111, 121 and bottom surfaces 141, 153, 171 in FIG. 14 may be approximately 300 μm or less.

Figure 15:
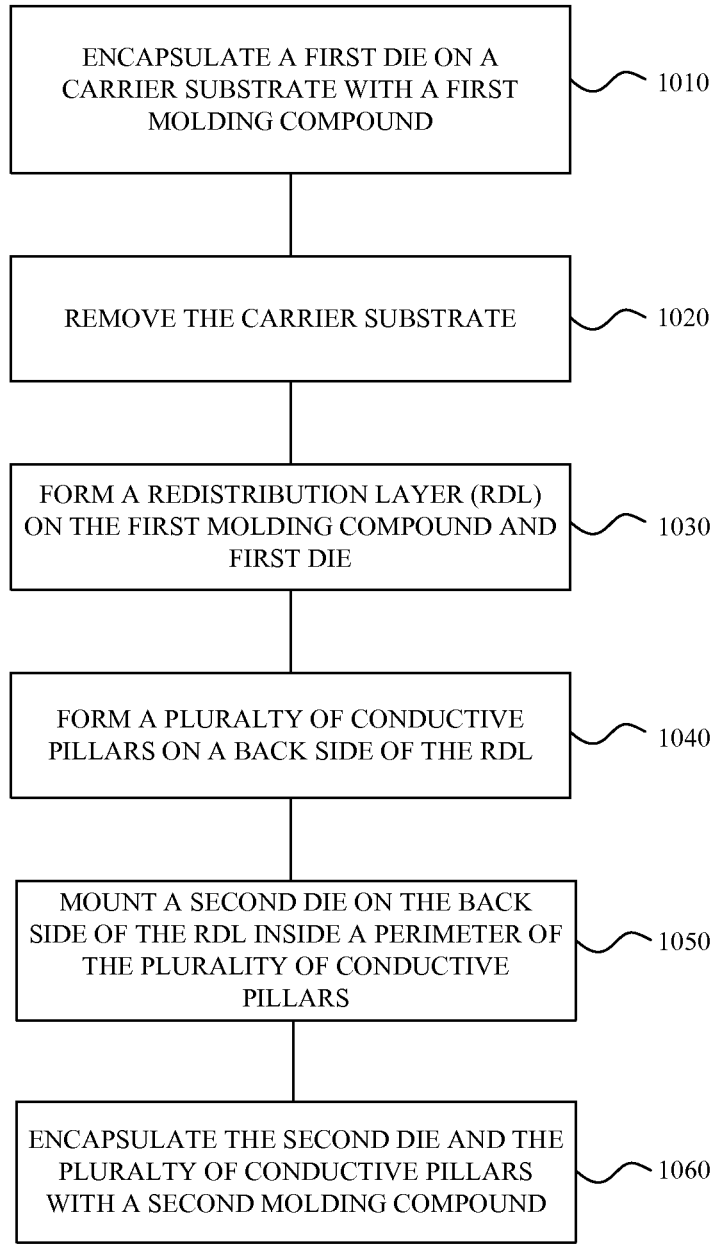
FIG. 15 is a flow chart illustrating a process of forming a fan out package in accordance with an embodiment.

FIG. 15 is a flow chart illustrating a method of forming a fan out package 100, such as a double side mounted fan out memory package, in accordance with an embodiment. At operation 1010 a first die 110 is encapsulated on a carrier substrate 102 with a first molding compound 120. The carrier substrate 102 is then removed at operation 1020, and an RDL 130 is formed on the first molding compound 120 and the first die 110 at operation 1030. For example, the RDL 130 may be formed such that a redistribution line 132 of the RDL is formed directly on a contact pad 112 along a bottom surface 113 of the first die 110. At operation 1040 a plurality of conductive pillars 140 are formed on a back side 133 of the RDL, and a second die 150 is mounted on the back side 133 of the RDL 130 inside a perimeter of the plurality of conductive pillars 140 at operation 1050. The second die 150 and the plurality of conductive pillars 140 are then encapsulated with a second molding compound 170 at operation 1060. In utilizing the various aspects of the embodiments, it would become apparent to one skilled in the art that combinations or variations of the above embodiments are possible for forming a fan out package, including, but not limited to, any of the variations illustrated and described above. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A package comprising:
   a redistribution layer (RDL);
   a first die bonded to a front side of the RDL, wherein a first redistribution line of the RDL is formed on a first contact pad of the first die;
   a first molding compound encapsulating the first die on the front side of the RDL;
   a second die mounted on a back side of the RDL;
   a plurality of conductive pillars extending from the back side of the RDL; and
   a second molding compound encapsulating the second die, the RDL, and the plurality of conductive pillars on the back side of the RDL, wherein the second molding compound completely laterally surrounds the RDL.

2. The package of claim 1, further comprising a plurality of conductive bumps on the plurality of conductive pillars.

3. The package of claim 1, wherein the first molding compound does not completely cover a top surface of the first die.

4. The package of claim 1, wherein the second molding compound does not completely cover a bottom surface of the second die.

5. The package of claim 4, wherein the first molding compound does not completely cover a top surface of the first die, and the second molding compound does not completely cover a bottom surface of the second die.

6. The package of claim 1, wherein a top surface of the first die and a top surface of the first molding compound are coplanar.

7. The package of claim 1, wherein a bottom surface of the second die, a bottom surface of the plurality of conductive pillars, and a bottom surface of the second molding compound are coplanar.

8. The package of claim 1, wherein:
   a top surface of the first die and a top surface of the first molding compound are coplanar; and
   a bottom surface of the second die, a bottom surface of the plurality of conductive pillars, and a bottom surface of the second molding compound are coplanar.

9. The package of claim 8, wherein the first die and the second die are memory die.

10. The package of claim 1, wherein the second die is bonded to the RDL with a conductive bump.

11. The package of claim 1, further comprising a plurality of first die bonded to the front side of the RDL, and a plurality of second die mounted on the back side of the RDL.

12. The package of claim 11, wherein:
    a top surface of the plurality of first die and a top surface of the first molding compound are coplanar; and
    a bottom surface of the plurality of second die, a bottom surface of the plurality of conductive pillars, and a bottom surface of the second molding compound are coplanar.

13. The package of claim 12, wherein the plurality of first die and the plurality of second die are memory die.

14. The package of claim 11, wherein the plurality of second die are located within a periphery of the plurality of conductive pillars and no conductive pillar is located between the second die.

15. The package of claim 14, wherein the RDL has a total thickness of less than 30 microns.

16. The package of claim 15, further comprising a top surface of the first molding compound and a bottom surface of the second molding compound, wherein the top surface and the bottom surface are separated by a thickness of 300 microns or less.

17. The package of claim 16, further comprising an electrically insulating material between the plurality of second die and the RDL.

18. The package of claim 17, wherein the RDL includes a first plurality of first under bump metallurgy (UBM) pads and a second plurality of second UBM pads, wherein the plurality of second die are mounted to the first plurality of first UBM pads, and the plurality of conductive pillars are formed on the second plurality of second UBM pads, and the second UBM pads are wider than the first UBM pads.

19. The package of claim 18, wherein the first die and the second die are memory die.

20. The package of claim 19, wherein the memory die are dynamic random access memory (DRAM) die.

* * * * *